United States Patent
Tamura et al.

(10) Patent No.: US 7,232,876 B2
(45) Date of Patent: Jun. 19, 2007

(54) PHOSPHORUS-CONTAINING URETHANE(METH)ACRYLATE COMPOUNDS AND PHOTOSENSITIVE COMPOSITIONS

(75) Inventors: Kenji Tamura, Kawasaki (JP); Yoshio Miyajima, Kawasaki (JP); Motoyuki Hirata, Kawasaki (JP)

(73) Assignee: Showa Denko K.K., Tokyo (JP)

( * ) Notice: Subject to any disclaimer, the term of this patent is extended or adjusted under 35 U.S.C. 154(b) by 56 days.

(21) Appl. No.: 10/501,864

(22) PCT Filed: Jan. 21, 2003

(86) PCT No.: PCT/JP03/00490

§ 371 (c)(1),
(2), (4) Date: Jul. 20, 2004

(87) PCT Pub. No.: WO03/062296

PCT Pub. Date: Jul. 31, 2003

(65) Prior Publication Data

US 2005/0107556 A1    May 19, 2005

Related U.S. Application Data

(60) Provisional application No. 60/350,359, filed on Jan. 24, 2002.

(30) Foreign Application Priority Data

Jan. 21, 2002    (JP) .............................. 2002-010932

(51) Int. Cl.
    *C08G 18/10*    (2006.01)
(52) U.S. Cl. ............................ 528/60; 528/61; 528/72; 528/905; 528/906

(58) Field of Classification Search ................. 528/60, 528/61, 72, 905, 906
See application file for complete search history.

(56) References Cited

U.S. PATENT DOCUMENTS

| | | | |
|---|---|---|---|
| 3,925,335 A | 12/1975 | Kuehn | |
| 4,082,634 A | 4/1978 | Chang | |
| 4,717,740 A | 1/1988 | Hung et al. | |
| 5,340,901 A * | 8/1994 | Wang | .......................... 528/60 |

FOREIGN PATENT DOCUMENTS

| | | |
|---|---|---|
| EP | 0 545 081 A1 | 6/1993 |
| EP | 1 238 997 A1 | 9/2002 |
| JP | 62-502848 A | 11/1987 |
| JP | 6-87939 A | 3/1994 |
| JP | 09-235449 A | 9/1997 |
| JP | 09-325490 A | 12/1997 |
| JP | 10-306201 A | 11/1998 |
| JP | 11-242331 A | 9/1999 |
| JP | 11-271967 A | 10/1999 |
| JP | 2000-309701 * | 11/2000 |
| WO | WO 95 02004 A1 | 1/1995 |
| WO | WO 00 52016 A1 | 9/2000 |

OTHER PUBLICATIONS

Patent Abstracts of Japan vol. 008, No. 279 (C-257), Dec. 20, 1984.
Patent Abstracts of Japan vol. 2000, No. 14, Mar. 5, 2001.

* cited by examiner

*Primary Examiner*—Robert D. Harlan
(74) *Attorney, Agent, or Firm*—Sughrue Mion, PLLC

(57) ABSTRACT

A phosphorus-containing urethane (meth)acrylate compound obtained by reacting (A) a polyol compound comprising (A1) a phosphorus-containing polyol having a phosphorus atom, with (B) a bifunctional or greater polyisocyanate and (C) a hydroxyl group-containing (meth)acrylate.

8 Claims, No Drawings

PHOSPHORUS-CONTAINING URETHANE(METH)ACRYLATE COMPOUNDS AND PHOTOSENSITIVE COMPOSITIONS

CROSS REFERENCE TO RELATED APPLICATION

This application is an application filed under 35 U.S.C. §111(a) claiming benefit pursuant to 35 U.S.C. §119(e)(1) of the filing date of the Provisional Application No. 60/350,359 filed on Jan. 24, 2002, pursuant to 35 U.S.C. §111(b).

FIELD OF THE INVENTION

The present invention relates to urethane (meth)acrylate compounds used as curing components in inks, paint coating compositions and adhesives, to a process for their production and to photosensitive compositions comprising them.

BACKGROUND ART

It has been known that urethane (meth)acrylate compounds, epoxy (meth)acrylate oligomers and polyester (meth)acrylate oligomers are oligomers which undergo curing by active energy rays such as ultraviolet rays.

Urethane (meth)acrylate compounds, when cured, form tough, high-mechanical-strength polymers which also exhibit high chemical resistance. Their cured polymers have excellent adhesion with a variety of materials and satisfactory processability. Urethane (meth)acrylate compounds are therefore widely employed as bases in different types of active energy ray-curing inks, paint coating compositions and adhesives.

Particularly, in the field of manufacturing printed wiring board, in resists and solder resists, more specifically in solder resists employed in manufacturing processes for film-like printed wiring boards (flexible printed circuits, or FPCS) for miniature devices, photosensitive compositions comprising urethane (meth)acrylate compounds as major components are being widely utilized. That is, in methods wherein a photosensitive composition is printed to form a cover coat on, or is attached as a film onto, a substrate, the coating of the photosensitive composition formed on the substrate may be followed by exposure, development, and heating to allow easy formation of intricately patterned cover coats or coverlays. Use of such photosensitive compositions offers advantages over conventional polyimide films as no expensive molds are necessary, the effort and cost of the attachment operation are not required, and intricate patterns can be easily formed.

Such photosensitive compositions must exhibit different properties depending on the intended applications. The important properties for use in electronic parts include heat resistance, insulation properties and flexibility, as well as flame retardance, since the applications are limited if the flame retardance is low.

With conventional photosensitive compositions, however, it has been difficult to provide satisfactorily high flame retardance. Methods of the prior art for imparting flame retardance include those using flame-retardant systems comprising halogenated flame retardants such as brominated epoxy resins, or combinations of these with flame retardant aids such as antimony trioxide (Japanese Unexamined Patent Publication HEI No. 9-325490, Japanese Unexamined Patent Publication HEI No. 11-242331). However, these flame-retardant systems have often been poorly reliable in high-temperature environments. Brominated epoxy resins have been associated with the problem of impairing flexibility when they are added in amounts sufficient to produce an adequate flame-retardant effect.

In recent years, restrictions have begun to be placed on halogenated resins such as decabromo ethers, in light of the problem of dioxins. Dehalogenation and elimination of antimony are also becoming requirements for resin molding materials used in electronic parts. This has also imposed a limit on the degree of improvement in flame-retardant effect achieved by addition of conventional types of flame-retardants.

Methods of using phosphoric acid esters as flame-retardants have been proposed (Japanese Unexamined Patent Publication HEI No. 9-235449, Japanese Unexamined Patent Publication HEI No. 10-306201, Japanese Unexamined Patent Publication HEI No. 11-271967, and others), but a simple inclusion of phosphoric acid esters in a composition gives a weak flame-retardant effect and fails to adequately meet the UL standards established for flame retardance.

A demand therefore exists for development of photosensitive compositions with high flame retardance while achieving dehalogenation and elimination of antimony.

It is an object of the present invention to provide urethane (meth)acrylate compounds with high flame retardance, as well as photosensitive compositions with excellent flame retardance in addition to such properties as photosensitivity, development capability and flexibility.

SUMMARY OF THE INVENTION

As a result of diligent research, the present inventors found that the aforementioned problems can be overcome by using phosphorus-containing urethane (meth)acrylate compounds having a phosphorus atom in the skeleton, as urethane (meth)acrylate curing components, and thereupon completed the present invention. Specifically, the invention relates to urethane (meth)acrylate compounds and photosensitive compositions defined by the following [1] to [29].

[1] A phosphorus-containing urethane (meth)acrylate compound obtained by reacting (A) a polyol compound comprising (A1) a phosphorus-containing polyol having a phosphorus atom, with (B) a bifunctional or greater polyisocyanate and (C) a hydroxyl group-containing (meth) acrylate.

[2] The phosphorus-containing urethane (meth)acrylate compound according to [1], characterized in that the polyol compound (A) is the phosphorus-containing polyol having a phosphorus atom (A1).

[3] The phosphorus-containing urethane (meth)acrylate compound according to [1], characterized in that the polyol compound (A) consists of (A1) the phosphorus-containing polyol with a phosphorus atom and (A2) a phosphorus-free polyol without a phosphorus atom.

[4] The phosphorus-containing urethane (meth)acrylate compound according to any one of [1] to [3], characterized in that at least one phosphorus-containing polyol (A1) is a phosphoric polyol represented by the following general formula (1) or (2):

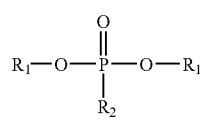

$$R_1\text{—}O\text{—}\underset{R_2}{\underset{|}{\overset{O}{\overset{\|}{P}}}}\text{—}O\text{—}R_1 \quad (1)$$

where each $R_1$ is independently hydrogen, $C_{1-18}$ alkyl or $C_{6-20}$ aryl, and $R_2$ is a group selected from the group consisting of polyhydroxyalkyl, polyhydroxyaryl, polyhydroxyalkylaminoalkyl, polyhydroxyarylaminoalkyl, polyhydroxyalkylaminoaryl and polyhydroxyarylaminoaryl.

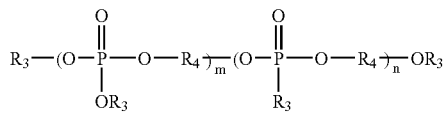

$$R_3\text{—}(O\text{—}\underset{OR_3}{\underset{|}{\overset{O}{\overset{\|}{P}}}}\text{—}O\text{—}R_4)_m(O\text{—}\underset{R_3}{\underset{|}{\overset{O}{\overset{\|}{P}}}}\text{—}O\text{—}R_4)_n OR_3 \quad (2)$$

where each $R_3$ is independently a group selected from the group consisting of $C_{1-18}$ alkyl, $C_{6-20}$ aryl, poly(alkyleneoxide) polyhydroxyalkyl, polyhydroxyaryl, polyhydroxyalkylaminoalkyl, polyhydroxyarylaminoalkyl, polyhydroxyalkylaminoaryl and polyhydroxyarylaminoaryl, with the proviso that at least one $R_3$ contains a polyhydroxy group; each $R_4$ is independently a group selected from the group consisting of $C_{1-18}$ alkylene and $C_{6-20}$ arylene; and m and n are each independently an integer of 0–1000, provided that at least one of m and n is 1 or greater.

[5] The phosphorus-containing urethane (meth)acrylate compound according to any one of [1] to [3], characterized in that at least one phosphorus-containing polyol (A1) is an aminophosphonate polyol represented by the following general formula (3).

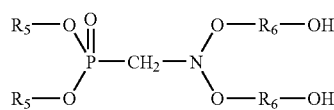

where each $R_5$ independently represents $C_{1-18}$ alkyl or $C_{6-20}$ aryl, alkylaryl or arylalkyl, which groups may have ether bonds or ester bonds and may contain hydroxyl groups; and each $R_6$ independently represents $C_{1-18}$ alkylene, which groups may have ether bonds or ester bonds and may contain hydroxyl groups.

[6] The phosphorus-containing urethane (meth)acrylate compound according to any one of [1] to [3], characterized in that at least one phosphorus-containing polyol (A1) is a phosphine compound represented by the following general formula (4).

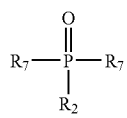

where $R_2$ is a group selected from the group consisting of polyhydroxyalkyl, polyhydroxyaryl, polyhydroxyalkylaminoalkyl, polyhydroxyarylaminoalkyl, polyhydroxyalkylaminoaryl and polyhydroxyarylaminoaryl, and each $R_7$ is independently $C_{1-18}$ alkyl or $C_{6-20}$ aryl.

[7] The phosphorus-containing urethane (meth)acrylate compound according to any one of [1] to [3], characterized in that at least one phosphorus-containing polyol (A1) is a phosphinic acid compound represented by the following general formula (5).

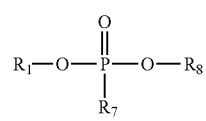

where $R_1$ is hydrogen, $C_{1-18}$ alkyl or $C_{6-20}$ aryl, $R_7$ is $C_{1-18}$ alkyl or $C_{6-20}$ aryl, and $R_8$ is a group selected from the group consisting of polyhydroxyalkyl, polyhydroxyaryl, polyhydroxyalkylaminoalkyl, polyhydroxyarylaminoalkyl, polyhydroxyalkylaminoaryl, polyhydroxyarylaminoaryl, polyhydroxyalkyloxycarbonylalkyl, polyhydroxyalkyloxycarbonylaryl, polyhydroxyaryloxycarbonylalkyl and polyhydroxyaryloxycarbonylaryl.

[8] The phosphorus-containing urethane (meth)acrylate compound according to any one of [1] to [7], characterized in that the proportion of the phosphorus-containing polyol (A1) in the polyol compound (A) which comprises the phosphorus-containing polyol (A1) and the phosphorus-free polyol (A2), is 30–100 wt % with respect to the total of the polyol compound (A).

[9] The phosphorus-containing urethane (meth)acrylate compound according to any one of [1] to [8], characterized in that the phosphorus content of the phosphorus-containing polyol (A1) is 5 wt % or greater.

[10] The phosphorus-containing urethane (meth)acrylate compound according to any one of [1] to [9], characterized in that the polyol compound (A) includes a carboxyl group-containing polyol having one or more carboxyl groups and two or more alcoholic hydroxyl groups.

[11] The phosphorus-containing urethane (meth)acrylate compound according to [10], characterized in that the carboxyl group-containing polyol is at least one branched or linear dihydroxyalkanoic polycarboxylic acid selected from the group consisting of dimethylolpropionic acid and dimethylolbutanoic acid.

[12] The phosphorus-containing urethane (meth)acrylate compound according to any one of [1] to [11], characterized in that the polyol compound (A) includes at least one selected from the group consisting of polyether polyols, polyester polyols, polylactone-based polyols and polycarbonate polyols.

[13] The phosphorus-containing urethane (meth)acrylate compound according to any one of [1] to [12], characterized in that the polyol compound (A) contains a $C_{2-10}$ glycol.

[14] The phosphorus-containing urethane (meth)acrylate compound according to any one of [1] to [13], characterized in that the bifunctional or greater polyisocyanate (B) is at least one selected from the group consisting of 2,4-toluene diisocyanate, 2,6-toluene diisocyanate, isophorone diisocyanate, hexamethylene diisocyanate, diphenylmethylene diisocyanate, (o, m or p)-xylene diisocyanate, methylenebis(cyclohexyl isocyanate), trimethylhexamethylene diisocyanate, cyclohexane-1,3-dimethylene diisocyanate, cyclohexane-1,4-dimethylene diisocyanate and 1,5-naphthalene diisocyanate.

[15] The phosphorus-containing urethane (meth)acrylate compound according to any one of [1] to [14], characterized in that the hydroxyl group-containing (meth)acrylate (C) is at least one selected from the group consisting of 2-hydroxyethyl (meth)acrylate, hydroxypropyl (meth)acrylate, hydroxybutyl (meth)acrylate, caprolactone or alkylene oxide adducts of any of the above acrylates, glycerin mono (meth)acrylate, glycerin di(meth)acrylate, glycidyl methacrylate-acrylic acid adduct, trimethylolpropane mono (meth)acrylate, trimethylol di(meth)acrylate, pentaerythritol tri(meth)acrylate, dipentaerythritol penta(meth)acrylate, ditrimethylolpropane tri(meth)acrylate and trimethylolpropane-alkylene oxide adduct-di(meth)acrylate.

[16] The phosphorus-containing urethane (meth)acrylate compound according to any one of [1] to [15], characterized in that the acid value of the solid portion is 5–150 mgKOH/g.

[17] The phosphorus-containing urethane (meth)acrylate compound according to any one of [1] to [16], characterized in that the weight-average molecular weight is 1000–40,000.

[18] A process for producting a phosphorus-containing urethane (meth)acrylate compound characterized by comprising polyaddition reaction of (A) a polyol compound comprising (A1) a phosphorus-containing polyol with (B) a bifunctional or greater polyisocyanate to form a urethane oligomer with isocyanate groups at both ends; and addition polymerization of (C) a hydroxyl group-containing (meth) acrylate to said urethane oligomer.

[19] The process for production of a phosphorus-containing urethane (meth)acrylate compound according to [18], characterized in that the polyol compound (A) includes a carboxyl group-containing polyol having one or more carboxyl groups and two or more alcoholic hydroxyl groups.

[20] The process for production of a phosphorus-containing urethane (meth)acrylate compound according to [18] or [19], characterized in that the polyol compound (A) includes at least one selected from the group consisting of polyether polyols, polyester polyols, polylactone-based polyols and polycarbonate polyols.

[21] A photosensitive composition comprising the phosphorus-containing urethane (meth)acrylate compound according to any one of [1] to [17].

[22] The photosensitive composition according to [21], characterized by comprising a phosphorus-free urethane (meth)acrylate compound obtained by reacting (A2) a phosphorus-free polyol having no phosphorus atoms, (B) a bifunctional or greater polyisocyanate and (C) a hydroxyl group-containing (meth)acrylate.

[23] The photosensitive composition according to [21] or [22], characterized by comprising a photopolymerizing monomer and/or a photopolymerizing oligomer.

[24] The photosensitive composition according to any one of [21] to [23] which contains a photopolymerization initiator in a range of 0.2–20 parts by weight to 100 parts by weight of the photocuring component.

[25] The photosensitive composition according to any one of [21] to [24], characterized by containing a thermosetting resin in a range of 5–40 wt % of the total photosensitive composition.

[26] The photosensitive composition according to any one of [21] to [25], characterized in that the proportion of the phosphorus-free urethane (meth)acrylate compound is in a range of 0–70 wt % with respect to the total of the urethane (meth)acrylate compound.

[27], The photosensitive composition according to any one of [21] to [26] characterized in that the amount of the phosphorus-containing urethane (meth)acrylate compound is in a range of 10–90 wt % of the total photosensitive composition.

[28] A cured photosensitive composition according to any one of [21] to [27].

[29] A coverlay film for a printed wiring board employing the composition comprising a phosphorus-containing urethane (meth)acrylate compound according to any one of [1] to [17].

[30] A solder resist for a printed wiring board employing the composition comprising a phosphorus-containing urethane (meth)acrylate compound according to any one of [1] to [17].

MODE OF CARRYING OUT THE INVENTION

The present invention will now be explained in greater detail.

I. Phosphorus-containing Urethane (meth)acrylate Compound

The urethane (meth)acrylate compound of the invention is a compound comprising a unit derived from a hydroxyl group-containing (meth)acrylate, a unit derived from a polyol and a unit derived from a polyisocyanate. More specifically, both ends consist of a unit derived from a hydroxyl group-containing (meth)acrylate, and the region between both ends consists of repeating units comprising a unit derived from a polyol and a unit derived from a polyisocyanate, which are linked with a urethane bond. The urethane (meth)acrylate compound of the invention contains a phosphorus atom in the unit derived from the polyol.

In other words, the urethane (meth)acrylate compound of the invention is obtained by reacting (A1) a phosphorus-containing polyol, containing at least one phosphorus-containing polyol with a phosphorus atom in the skeleton, (B) a bifunctional or greater polyisocyanate, (C) a hydroxyl group-containing (meth)acrylate and if necessary, (A2) a phosphorus-free polyol with no phosphorus atom. The phosphorus-containing polyol (A1) and phosphorus-free polyol (A2) are collectively considered as the polyol compound (A).

(1)-1 Phosphorus-containing Polyol (A1)

The phosphorus-containing polyol (A1) used in the invention is a polyol with a phosphorus atom in the skeleton.

As such phosphorus-containing polyols (A1) there may be mentioned phosphorus-containing polyols represented by the following general formula (1) or (2), aminophosphonates represented by general formula (3), phosphine compounds represented by general formula (4), phosphinic acid compounds represented by general formula (5) and phosphazene compounds represented by general formula (6):

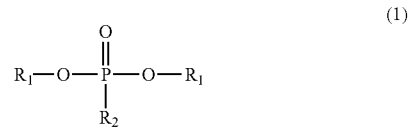

where each $R_1$ is independently hydrogen, $C_{1-18}$ alkyl or $C_{6-20}$ aryl, and $R_2$ is a group selected from the group consisting of polyhydroxyalkyl, polyhydroxyaryl, polyhydroxyalkylaminoalkyl, polyhydroxyarylaminoalkyl, polyhydroxyalkylaminoaryl and polyhydroxyarylaminoaryl.

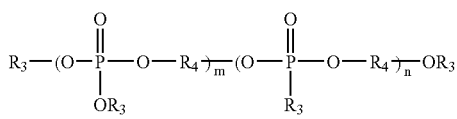
(2)

where each $R_3$ is independently a group selected from the group consisting of $C_{1-18}$ alkyl, $C_{6-20}$ aryl, poly(alkyleneoxide)polyhydroxyalkyl, polyhydroxyaryl, polyhydroxyalkylaminoalkyl, polyhydroxyarylaminoalkyl, polyhydroxyalkylaminoaryl and polyhydroxyarylaminoaryl, with the proviso that at least one $R_3$ has a polyhydroxy group; each $R_4$ is independently a group selected from the group consisting of $C_{1-18}$ alkylene and $C_{6-20}$ arylene; and m and n are each independently an integer of 0–1000, with the proviso that at least one is 1 or greater.

In formula (2), m and n are each independently an integer of 0–1000, preferably 10–200 and more preferably 10–100, with the proviso that at least one thereof is 1 or greater. Also, the constituent units defined by m and n may be in a block, random or alternating bonded form.

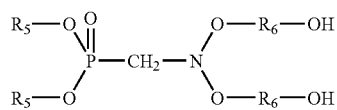
(3)

where each $R_5$ independently represents $C_{1-18}$ alkyl or $C_{6-20}$ aryl, alkylaryl or arylalkyl, which groups may have an ether bond or ester bond and may contain a hydroxyl group; and each $R_6$ independently represents $C_{1-18}$ alkylene, which groups may have an ether bond or ester bond and may contain a hydroxyl group.

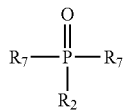
(4)

where $R_2$ is a group selected from the group consisting of polyhydroxyalkyl, polyhydroxyaryl, polyhydroxyalkylaminoalkyl, polyhydroxyarylaminoalkyl, polyhydroxyalkylaminoaryl and polyhydroxyarylaminoaryl, and each $R_7$ is independently $C_{1-18}$ alkyl or $C_{6-20}$ aryl.

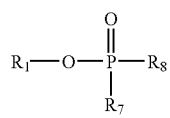
(5)

where each $R_1$ is independently hydrogen, $C_{1-18}$ alkyl or $C_{6-20}$ aryl, $R_7$ is $C_{1-18}$ alkyl or $C_{6-20}$ aryl, and $R_8$ is a group selected from the group consisting of polyhydroxyalkyl, polyhydroxyaryl, polyhydroxyalkylaminoalkyl, polyhydroxyarylaminoalkyl, polyhydroxyalkylaminoaryl, polyhydroxyarylaminoaryl, polyhydroxyalkyloxycarbonylalkyl, polyhydroxyalkyloxycarbonylaryl, polyhydroxyaryloxycarbonylalkyl and polyhydroxyaryloxycarbonylaryl.

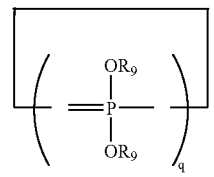
(6)

where each $R_9$ independently represents $C_{1-18}$ alkyl or aryl, and q represents an integer of 3–5.

In general formulas (1) to (6), the alkyl groups are preferably $C_{1-18}$ linear or branched aliphatic groups. Specifically there may be mentioned linear or branched alkyl groups such as methyl, ethyl, n-propyl, isopropyl, n-butyl, sec-butyl, isobutyl, tert-butyl, pentyl, isopentyl, tert-pentyl, hexyl, heptyl, octyl, isooctyl, 2-ethylhexyl, tert-octyl, nonyl, isononyl, tert-nonyl, decyl, isodecyl, dodecyl, tridecyl, isotridecyl, tetradecyl, hexadecyl and octadecyl.

The alkylene groups are preferably $C_{1-18}$ and more preferably $C_{2-6}$ linear or branched aliphatic residues, and there may be mentioned specifically methylene, ethylene, n- or iso-propylene and n-, sec-, iso- or tert-butylene.

The aryl groups are preferably $C_{6-20}$ aromatic ring-containing groups, including, specifically, phenyl, naphthyl, anthracenyl, biphenyl and quinolyl. The aromatic ring may be unsubstituted or substituted with an alkyl group or the like. The arylene groups are preferably $C_{6-20}$ aromatic ring-containing aromatic residues, including, specifically, phenylene, naphthylene, anthracenylene, biphenylene and quinolinene. The aromatic ring may be unsubstituted or substituted with an alkyl group or the like.

A poly(alkyleneoxide) is an alternating series of an alkyl group and oxygen atoms, and examples thereof include polyethylene oxide, polypropylene oxide and polybutylene oxide.

A polyhydroxyalkyl group is an alkyl group with two or more hydroxy (—OH) groups. A polyhydroxy aryl group is an aryl group with two or more hydroxy functional groups. A polyhydroxyalkylaminoalkyl group is an alkyl group with a bonded amino group, wherein the amino group is substituted with a hydroxy group-containing alkyl group and at least two hydroxy groups are present. A polyhydroxyarylaminoalkyl group is an aryl group with a bonded amino group, wherein the amino group is substituted with a hydroxy group-containing alkyl group and at least two hydroxy groups are present. A polyhydroxyarylaminoaryl group is an aryl group with a bonded amino group, wherein the amino group is substituted with a hydroxy group-containing aryl group and at least two hydroxy groups are present.

As alkyl groups represented by $R_5$ in formula (3) there may be mentioned linear or branched alkyl groups such as eicosyl, docosyl, tetracosyl and triacontyl, in addition to the $C_{1-18}$ alkyl groups mentioned above. As examples of arylalkyl groups there may be mentioned benzyl, α-methylbenzyl and α,α-dimethylbenzyl, and as examples of alkylaryl groups there may be mentioned aryl groups substituted with the alkyl groups mentioned above.

As preferred examples of phosphorus-containing polyols represented by general formula (1) there may be mentioned diethyl-N,N-bis(2-hydroxyethyl)aminomethyl phosphonate, available on the market as "FYROL™ 6" by Akzo Nobel Co.

The preferred structure for a phosphorus-containing polyol represented by general formula (2) is one wherein each $R_3$ is independently a hydroxyl-containing group represented by the following general formula:

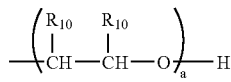
(7)

where each $R_{10}$ is independently hydrogen or $C_{1-6}$ alkyl, and "a" indicates an average chain length of 0–4, each $R_3$ is independently $C_{1-12}$ and preferably $C_{1-5}$ alkyl, aryl or alkylaryl, and each $R_4$ is a group represented by the following general formula (8)

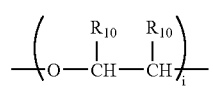
(8)

where each $R_{10}$ is independently hydrogen or $C_{1-6}$ alkyl, and i indicates an average chain length of 0–4.

As preferred examples of the above there may be mentioned commercially available water-soluble hydroxy group-containing oligomeric phosphorus-containing polyols such as "FYROL™ 51", by Akzo Nobel Co. and "EXOLIT OP550" by Clariant (Japan) K.K. Such a substance may be produced from the reaction product of, for example, dimethylmethylphosphonate, phosphorus pentaoxide, ethylene oxide and water in a molar ratio of 2:2:8:1.

As specific examples of aminophosphonate polyols represented by general formula (3) there may be mentioned diisopropyl-N,N-bis(2-hydroxyethyl)aminomethyl phosphonate, diisobutyl-N,N-bis(2-hydroxyethyl)aminomethyl phosphonate, dioctyl-N,N-bis(2-hydroxyethyl)aminomethyl phosphonate, dioctadecyl-N,N-bis(2-hydroxyethyl)aminomethyl phosphonate, diethyl-N,N-bis(2-hydroxyethyl)aminomethyl phosphonate, diethyl-N,N-bis[2-(2-hydroxyethoxy)ethyl]aminomethyl phosphonate, diethyl-N,N-bis[ω-(2-hydroxy)polyethoxyethyl]aminomethyl phosphonate and diethyl-N,N-bis(2-hydroxypropyl)aminomethyl phosphonate.

As a preferred example among these there may be mentioned diethyl-N,N-bis(2-hydroxyethyl)aminomethyl phosphonate which is commercially available as "ADEKA POLY ETHER FC-450" by Asahi Denka Co., Ltd.

As a preferred example of a phosphine compound represented by general formula (4) there may be mentioned n-butyl-bis(3-hydroxypropyl)phosphine oxide which is commercially available as "PO-4500" by Nippon Chemical Industrial Co., Ltd.

As a preferred example of a phosphinic acid compound represented by general formula (5) there may be mentioned oxaphospholane-glycol ester which is commercially available as "EXOLIT PE 100" by Clariant (Japan) K.K.

As a preferred example of a phosphazene compound represented by general formula (6) there may be mentioned the cyclic phosphazene compounds described in Japanese Unexamined Patent Publication HEI No. 10-259292.

More preferred among these phosphorus-containing polyols (A1) are phosphorus-containing polyols represented by general formulas (1) and (2), aminophosphonate polyols represented by general formula (3), phosphine compounds represented by general formula (4) and phosphinic acid compounds represented by general formula (5), and particularly preferred are phosphorus-containing polyols represented by general formula (2). Two or more of these phosphorus-containing polyols (A1) may also be used in combination.

The phosphorus content of the phosphorus-containing polyol (A1) is not particularly restricted, but is preferably at least 5 wt % and more preferably 10–30 wt %.

If the phosphorus content is too low, the improvement in flame retardance may be inadequate.

(1)-2 Phosphorus-free Polyol (A2)

The polyol compound (A) of the invention may consist of the phosphorus-containing polyol (A1) alone, but there may also be used in combination therewith a phosphorus-free polyol (A2) which is commonly used for production of urethane (meth)acrylate compounds. Different types of phosphorus-free polyols (A2) may also be used together. As such phosphorus-free polyols there may be used polymeric polyols and/or dihydroxy compounds.

As polymeric polyols there may be mentioned polyether polyols such as polyethylene glycol, polypropylene glycol and polytetramethylene glycol, polyester polyols obtained from esters of polyhydric alcohols and polybasic acids, polycarbonate polyols comprising constituent units derived from hexamethylene carbonate, pentamethylene carbonate or the like, and polylactone-based polyols such as polycaprolactone diol a and polybutyrolactone diol.

These polymeric polyols may be used alone or in combinations of two or more. Polymeric polyols with a weight-average molecular weight of 200–2000 are preferred for superior flexibility of the cured film. Among these polymeric polyols, the use of polycarbonate diols is preferred for high heat resistance and excellent pressure cooker resistance of the cured film. It is preferred for the polymeric polyol to comprise a plurality of different constituent units instead of only one type of constituent unit, in order to further increase the flexibility of the cured film. As polymeric polyols comprising a plurality of different constituent units there may be mentioned polyether polyols comprising units derived from ethylene glycol and propylene glycol as constituent units, polycarbonate polyols comprising units derived from hexamethylene carbonate and pentamethylene carbonate as constituent units, and polyester polyols.

As dihydroxy compounds there may be used branched or linear compounds with two alcoholic hydroxy groups. Specifically, there may be used ethylene glycol, diethylene glycol, propylene glycol, 1,4-butanediol, 1,3-butanediol, 1,5-pentanediol, neopentyl glycol, 3-methyl-1,5-pentanediol, 1,6-hexanediol, 1,4-cyclohexanedimethanol, hydroquinone, and the like. More preferred is at least one type selected from among $C_{2-10}$ glycols. Even more preferred is a $C_{2-6}$ glycol, and specifically ethylene glycol, diethylene glycol, propylene glycol, 1,4-butanediol, neopentyl glycol or 3-methyl-1,5-pentanediol.

The dihydroxy compound may be used alone or two or more types in combination, and it may be used together with a polymeric polyol.

From the standpoint of allowing alkali development, the polyol compound (A) according to the invention preferably also includes a carboxyl group-containing polyol having one or more carboxyl groups and two or more alcoholic hydroxyl groups.

When a carboxyl group-containing polyol is used, for example in the case of a polymeric polyol, a compound synthesized in the presence of a trivalent or greater polybasic acid such as trimellitic acid (or anhydride) so as to have a residual carboxyl group may be used. In the case of a dihydroxy compound, a dihydroxy aliphatic carboxylic acid is preferably used. As such dihydroxy compounds there may be mentioned any one or more branched or linear dihydroxyalkanoic polycarboxylic acids selected from the group consisting of dimethylolpropionic acid and dimethylolbutanoic acid. Carboxyl groups can be easily added to urethane (meth)acrylate compounds by using such carboxyl group-containing polyols.

The proportion of the phosphorus-containing polyol (A1) in the polyol compound (A) of the invention is not particularly restricted, but it is preferably 30–100 wt % and more preferably 40–90 wt % with respect to the total of the polyol compound (A). If the proportion of the phosphorus-containing polyol is too low, the improvement in flame retardance may be inadequate.

(2) Polyisocyanate (B)

As polyisocyanates to be used in the invention there may be mentioned diisocyanates such as, specifically, 2,4-toluene diisocyanate, 2,6-toluene diisocyanate, isophorone diisocyanate, hexamethylene diisocyanate, diphenylmethylene diisocyanate, (o, m or p)-xylene diisocyanate, methylenebis(cyclohexyl isocyanate), trimethylhexamethylene diisocyanate, cyclohexane-1,3-dimethylene diisocyanate, cyclohexane-1,4-dimethylene diisocyanate and 1,5-naphthalene diisocyanate. These polyisocyanates may be used alone or in combinations of 2 or more. A carboxyl group-containing polyisocyanate may also be used.

(3) Hydroxyl Group-containing (Meth)acrylate (C)

As hydroxyl group-containing (meth)acrylates (C) to be used for the invention there may be mentioned 2-hydroxyethyl (meth)acrylate, hydroxypropyl (meth)acrylate, hydroxybutyl (meth)acrylate, caprolactone or alkylene oxide adducts of any of the above acrylates, glycerin mono (meth)acrylate, glycerin di(meth)acrylate, glycidyl methacrylate-acrylic acid adduct, trimethylolpropane mono (meth)acrylate, trimethylol di(meth)acrylate, pentaerythritol tri(meth)acrylate, dipentaerythritol penta(meth)acrylate, ditrimethylolpropane tri(meth)acrylate and trimethylolpropane-alkylene oxide adduct-di(meth)acrylate. The term "(meth)acrylate" refers to either or both "methacrylate" and "acrylate".

These hydroxyl group-containing (meth)acrylates (C) may be used alone or in combinations of 2 or more. Among those mentioned are preferred 2-hydroxyethyl (meth)acrylate, hydroxypropyl (meth)acrylate and hydroxybutyl (meth) acrylate, with 2-hydroxyethyl (meth)acrylate being more preferred. Using 2-hydroxyethyl (meth)acrylate will further facilitate synthesis of a phosphorus-containing urethane (meth)acrylate compound if a carboxyl group-containing polyol is also used together as the polyol compound.

(4) Properties of Phosphorus-containing Urethane (Meth)acrylate Compound

There are no particular restrictions on the molecular weight of a phosphorus-containing urethane (meth)acrylate compound according to the invention, but it is preferably a weight-average molecular weight of 1,000–40,000 and more preferably 8,000–30,000. The weight-average molecular weight is the value in terms of polystyrene as measured by gel permeation chromatography. If the weight-average molecular weight of the phosphorus-containing urethane (meth)acrylate compound is less than 1,000, the ductility and strength of cured films from the photosensitive composition may be impaired, while if it is greater than 40,000, the composition becomes hard and may result in reduced flexibility.

When two or more types of either or both the polyol compound (A) and polyisocyanate (B) are used in the phosphorus-containing urethane (meth)acrylate compound of the invention, the repeating units will be of a plurality of types, and the regularity of such plurality of units may be completely random, block, local, etc. as appropriately selected depending on the purpose.

A portion of the hydroxyl groups of the polyol compound (A) may be groups with active hydrogen, such as mercapto or amino groups. A portion of the isocyanate groups of the polyisocyanate (B) may be groups that are reactive with the polyol compound (A), such as carboxyl groups. The hydroxyl group-containing (meth)acrylate (C) may have a group that is reactive with the polyol compound (A), such as an isocyanate group. The phosphorus-containing urethane (meth)acrylate compound of the invention may therefore have ester bonds or ether bonds in its structure.

The solid portion acid value of the phosphorus-containing urethane (meth)acrylate compound is preferably 5–150 mgKOH/g and more preferably 30–120 mgKOH/g. If the solid portion acid value is less than 5 mgKOH/g, the alkali solubility of the photosensitive composition may be impaired, and if it exceeds 150 mgKOH/g, the alkali resistance and electrical properties of the cured film may be impaired. The solid portion acid value is the value measured according to JIS K0070.

(5) Process for Production of Phosphorus-containing Urethane (Meth)acrylate Compound There are no particular restrictions on the process for production of a phosphorus-containing urethane (meth)acrylate compound according to the invention, and there may be employed any of various production processes for ordinary urethane (meth)acrylate compounds. For example, it may be produced by (1) a method wherein a polyol compound (A), a polyisocyanate (B) and a hydroxyl group-containing (meth)acrylate (C) are reacted as a batch mixture, (2) a method wherein a polyol compound (A) and a polyisocyanate (B) are reacted to produce a urethane isocyanate prepolymer containing one or more isocyanate groups per molecule, and then the urethane isocyanate prepolymer is reacted with a hydroxyl group-containing (meth)acrylate (C), or (3) a method wherein a hydroxyl group-containing (meth)acrylate (C) and a polyisocyanate (B) are reacted to produce a urethane isocyanate prepolymer containing one or more isocyanate groups per molecule, and then this prepolymer is reacted with a polyol compound. At least one compound used as the polyol compound (A) must be a phosphorus-containing polyol (A1).

Particularly preferred is the following process.

Step (I)

A polyol compound (A) and a polyisocyanate (B) are subjected to polyaddition reaction to obtain (a) a urethane oligomer with isocyanate groups at both ends.

Step (II)

A hydroxyl group-containing (meth)acrylate (C) is used for addition polymerization with the urethane oligomer with isocyanate groups at both ends (a). The polyol compound (A) used in this case includes the aforementioned phosphorus-containing polyol (A1), and preferably a carboxyl group-containing polyol and/or a polymeric polyol selected from among polyether polyols, polycarbonate polyols, polylactone-based polyols and polyester polyols, or a $C_{2-10}$ glycol.

In step (I) of the production process described above, the polyol compound (A) and the polyisocyanate (B) are preferably reacted in a molar ratio such that the proportion of isocyanate groups in (B) with respect to hydroxyl groups in (A) is greater than 1, in order to obtain a diol prepolymer with isocyanate groups at both ends (a). In step (II), (a) and the hydroxyl group-containing (meth)acrylate (C) are preferably reacted in a molar ratio such that the proportion of hydroxyl groups in (C) with respect to isocyanate groups in (a) is 1 or greater, in order to obtain a phosphorus-containing urethane (meth)acrylate compound.

In step (I), when two or more different components (A), that is, a phosphorus-containing polyol and at least one type selected from the group consisting of carboxyl group-containing polyols, polyether polyols, polyester polyols and polycarbonate polyols, are reacted to obtain a diol prepolymer with isocyanate groups at both ends (a), the method may involve serial reaction of components (A) and component (B) or batch reaction of the components (A) and (B).

II. Photosensitive Composition (1) Urethane (Meth)acrylate Compound

The photosensitive composition according to the invention comprises a urethane (meth)acrylate compound as a curing component.

The aforementioned phosphorus-containing urethane (meth)acrylate compounds are essential in the urethane (meth)acrylate compound, but a phosphorus-free urethane (meth)acrylate compound comprising a species with no phosphorus atoms in the skeleton may also be used together therewith in the polyol compound.

Phosphorus-free polyols (A2) which may be used for production of phosphorus-free urethane (meth)acrylate compounds include polymeric polyols such as polyether polyols, polyester polyols, hexamethylene carbonate, polycarbonate polyols and polylactone-based diols, or dihydroxy compounds such as ethylene glycol, diethylene glycol, propylene glycol, 1,4-butanediol, 1,3-butanediol, 1,5-pentanediol, neopentyl glycol, 3-methyl-1,5-pentanediol, 1,6-hexanediol, 1,4-cyclohexanedimethanol, hydroquinone, and the like, which were mentioned as usable with the phosphorus-containing polyol in the explanation of the aforementioned phosphorus-containing urethane (meth)acrylate compound.

The use of a carboxyl group-containing polyol as the phosphorus-free polyol (A2) is even more preferable from the standpoint of allowing alkali development. As the carboxyl group-containing polyols there may be mentioned those which can be used for the aforementioned phosphorus-containing urethane (meth)acrylate compounds, for example, compounds obtained in the co-presence of polybasic acids during synthesis of the polymer polyols, or at least one branched or linear dihydroxyalkanoic polycarboxylic acid selected from the group consisting of dimethylolpropionic acid and dimethylolbutanoic acid. In addition, there may be used polyisocyanates or hydroxyl group-containing (meth)acrylates that can be used for production of phosphorus-containing urethane (meth)acrylate compounds.

The mixing proportion of the phosphorus-containing urethane (meth)acrylate and the phosphorus-free urethane (meth)acrylate compound in the photosensitive composition according to the invention may be appropriately determined depending on the phosphorus content in the total photosensitive composition. The phosphorus-containing urethane (meth)acrylate compound content in the total photosensitive composition is in the range of preferably 10–90 wt %, more preferably 30–70 wt % and even more preferably 40–60 wt %. Sufficient flame retardance can be maintained if the content is within this range.

The proportion of the phosphorus-free urethane (meth)acrylate compound with respect to the total urethane (meth)acrylate compound will differ depending on the phosphorus content and is not particularly restricted, but it is preferably 0–70 wt % with respect to the total urethane (meth)acrylate compound. That is, the phosphorus-free urethane (meth)acrylate compound may be either added or omitted. The proportion is more preferably 10–50 wt %.

The solid portion acid value of the phosphorus-containing urethane (meth)acrylate compound is preferably in the range of 5–150 mgKOH. The solid portion acid value of the total urethane (meth)acrylate compound is also preferably in the range of 5–150 mgKOH. A higher solid portion acid value improves the developing property but tends to result in lower flexibility, while a lower solid proportion acid value increases the flexibility but tends to reduce the developing property and produce developing residue. In this case, the use of a combination of at least two different urethane (meth)acrylate compounds with different solid portion acid values can sometimes give a photosensitive composition with excellent flexibility and a satisfactory developing property.

It is preferable to employ a combination of at least one type each of a urethane (meth)acrylate compound with a solid portion acid value of 5 mgKOH/g or greater and less than 60 mgKOH/g (hereinafter referred to as "urethane (meth)acrylate compound (Ua)") and a urethane (meth)acrylate compound with a solid portion acid value of 60 mgKOH/g or greater and no greater than 150 mgKOH/g (hereinafter referred to as "urethane (meth)acrylate compound (Ub)").

In the case of the combination, the proportions of use are preferably urethane (meth)acrylate compound (Ua):urethane (meth)acrylate compound (Ub)=40–90:60–10 by weight and more preferably urethane (meth)acrylate compound (Ua):urethane (meth)acrylate compound (Ub)=50–80:50–20 by weight, with respect to the total urethane (meth)acrylate compound (100 parts by weight).

(2) Other Components (i) Photopolymerizable Monomer

The photocuring component in the photosensitive composition may contain a compound with an ethylenic unsaturated group (photopolymerizable monomer) in addition to the urethane (meth)acrylate compound. This is used for the purpose of adjusting the viscosity of the photosensitive composition or modifying the properties such as heat resistance and flexibility after curing of the photosensitive composition. A (meth)acrylic acid ester is preferred for use.

Specifically, there may be mentioned alkyl (meth)acrylates such as methyl (meth)acrylate, ethyl (meth)acrylate, propyl (meth)acrylate, butyl (meth)acrylate, isobutyl (meth)acrylate, sec-butyl (meth)acrylate, tert-butyl (meth)acrylate, hexyl (meth)acrylate, octyl (meth)acrylate, isooctyl (meth)acrylate, 2-ethylhexyl (meth)acrylate, decyl (meth)acrylate, lauryl (meth)acrylate and stearyl (meth)acrylate; alicyclic (meth)acrylates such as cyclohexyl (meth)acrylate, bornyl (meth)acrylate, isobornyl (meth)acrylate, dicyclopentenyl (meth)acrylate and dicyclopentenyloxyethyl (meth)acrylate; aromatic (meth)acrylates such as benzyl (meth)acrylate, phenyl (meth)acrylate, phenylcarbitol(meth)acrylate, nonylphenyl (meth)acrylate, nonylphenylcarbitol(meth)acrylate and nonylphenoxy(meth)acrylate; hydroxy group-containing (meth)acrylates such as 2-hydroxyethyl (meth)acrylate, hydroxypropyl (meth)acrylate, hydroxybutyl (meth)acrylate, butanediol mono(meth)acrylate, glycerol (meth)acrylate, phenoxyhydroxypropyl (meth)acrylate, polyethyleneglycol (meth)acrylate or glycerol di(meth)acrylate; amino group-containing (meth)acrylates such as 2-dimethylaminoethyl (meth)acrylate, 2-diethylaminoethyl (meth)acrylate and 2-tert-butylaminoethyl (meth)acrylate; phosphorus atom-containing (meth)acrylates such as methacryloxyethyl phosphate, bismethacryloxyethyl phosphate and methacryloxyethylphenyl acid phosphate (phenyl P); diacrylates such as ethyleneglycol di(meth)acrylate, diethyleneglycol di(meth)acrylate, triethyleneglycol di(meth)acrylate, tetraethylene di(meth)acrylate, polyethyleneglycol di(meth)acrylate, propyleneglycol di(meth)acrylate, dipropyleneglycol di(meth)acrylate, tripropyleneglycol di(meth)acrylate, 1,4-butanediol di(meth)acrylate, 1,3-butanediol di(meth)acrylate, neopentylglycol di(meth)acrylate, 1,6-hexanediol di(meth)acrylate and bisglycidyl (meth)acrylate; polyacrylates such as trimethylolpropane tri(meth)acrylate, pentaerythritol tri(meth)acrylate and dipentaerythritol hexa(meth)acrylate; modified polyol polyacrylates such as bisphenol S ethylene oxide tetramolar modified diacrylate, bisphenol A ethylene oxide tetramolar modified diacrylate, fatty acid modified pentaerythritol diacrylate, trimethylolpropane propylene oxide trimolar modified triacrylate and trimethyolpropane propylene oxide hexamolar modified triacrylate; polyacrylates with isocyanuric acid skeletons such as bis(acryloyloxyethyl)monohydroxyethyl isocyanurate, tris(acryloyloxyethyl)isocyanurate and ε-caprolactone-modified tris(acryloyloxyethyl)isocyanurate; polyester acrylates such as α,ω-diacryloyl-(bisethyleneglycol)phthalate and α,ω-tetracryloyl-(bistrimethylolpropane)tetrahydrophthalate; glycidyl (meth)acrylate; allyl (meth)acrylate; ω-hydroxyhexanoyloxyethyl (meth)acrylate; polycaprolactone (meth)acrylate; (meth)acryloyloxyethyl phthalate; (meth)acryloyloxyethyl succinate; 2-hydroxy-3-phenoxypropyl acrylate; and phenoxyethyl acrylate.

In addition, N-vinyl compounds such as N-vinylpyrrolidone, N-vinylformamide and N-vinylacetamide, or polyester acrylates, urethane acrylates and epoxy acrylates may also be used as the compounds with ethylenic unsaturated groups.

Preferred among these are hydroxyl group-containing (meth)acrylates, glycidyl (meth)acrylates and urethane acrylates, and there may be mentioned, as the hydroxyl group-containing (meth)acrylates, 2-hydroxyethyl (meth)acrylate, hydroxypropyl (meth)acrylate and hydroxybutyl (meth)acrylate, and urethane acrylate. Polyacrylates with three or more ethylenic unsaturated groups such as pentaerythritol tri(meth)acrylate or dipentaerythritol hexa(meth)acrylate are more preferred for higher heat resistance.

The mixing ratio of the urethane (meth)acrylate compound (Ea) and the compound with an ethylenic unsaturated group (Eb) is preferably (Ea):(Eb)=95:5–50:50, more preferably 90:10–60:40 and even more preferably 85:15–70:30, in terms of weight ratio. If the content of component (Ea) exceeds 95 wt %, the solder heat resistance of cured films obtained from the photosensitive composition may be reduced, and if the content of component (Ea) is less than 50 wt %, the alkali solubility of the photosensitive composition will tend to be lower.

(ii) Photopolymerization Initiator

As the photopolymerization initiators to be used in the invention there may be mentioned benzophenones such as benzophenone, benzoylbenzoic acid, 4-phenylbenzophenone, hydroxybenzophenone and 4,4'-bis(diethylamino)benzophenone, benzoinalkyl ethers such as benzoin, benzoinmethyl ether, benzoinethyl ether, benzoinisopropyl ether, benzoinbutyl ether and benzoinisobutyl ether, acetophenones such as 4-phenoxydichloroacetophenone, 2-hydroxy-2-methyl-1-phenylpropan-1-one, 1-(4-isopropylphenyl)-2-hydroxy-2-methylpropan-1-one, 1-[4-(2-hydroxyethoxy)phenyl]-2-hydroxy-di-2-methyl-1-propan-1-one, 1-hydroxy-cyclohexyl-phenylketone, 2,2-dimethoxy-1,2-diphenylethan-1-one, 2,2-diethoxy-1,2-diphenylethanone, 2-methyl-1-[4-(methylthio)phenyl]-2-morpholinopropanone-1,4-t-butyl-dichloroacetophenone, 4-t-butyl-trichloroacetophenone, diethoxyacetophenone and 2-benzyl-2-dimethylamino-1-(4-morpholinophenyl)-butanone-1,1-phenyl-1,2-propanedione-2-(o-ethoxycarbonyl)oxime, thioxanthones such as thioxanthone, 2-chlorthioxanthone, 2-methylthioxanthone and 2,4-dimethylthioxanthone, alkylanthraquinones such as ethylanthraquinone and butylanthraquinone, and acylphosphine oxides such as 2,4,6-trimethylbenzoyldiphenylphosphine oxide. These may be used alone or in mixtures of two or more.

There may also be used photoacid generators such as 2,2,2-trichloro-[1-4'-(1,1-dimethylethyl)phenyl]ethanone, 2,2-dichloro-1,4'-(phenoxyphenyl)ethanone, α, α, α-tribromomethylphenylsulfone, 2,4,6-tris(trichloromethyl)triazine, 2,4-trichloromethyl-(4'-methoxyphenyl)-6-triazine, 2,4-trichloromethyl-(4'-methoxystyryl)-6-triazine, 2,4-trichloromethyl-(piplronyl)-6-triazine, 2,4-trichloromethyl-(4'-methoxynaphthyl)-6-triazine, 2-[2'-(5''-methylfuryl)ethylidene]-4,6-bis(trichloromethyl)-s-triazine and 2-(2'-furylethylidene)-4,6-bis(trichloromethyl)-s-triazine.

A photosensitizing agent may also be used in combination therewith if necessary.

Preferred among these photopolymerization initiators are benzophenones, acetophenones and acylphosphine oxides. Specifically, there may be mentioned 4,4'-bis(diethylamino)benzophenone, 2-benzyl-2-dimethylamino-1-(4-morpholinophenyl)butanone-1, and 2,4,6-trimethylbenzoyldiphenylphosphine oxide.

The amount of such photopolymerization initiators is preferably 0.1–20 parts by weight and more preferably 0.2–10 parts by weight with respect to 100 parts by weight of the total photocuring component comprising a urethane (meth)acrylate compound, an ethylenic unsaturated bond-containing compound (photopolymerizable monomer) and a photopolymerizable oligomer such as mentioned below. If the amount of the photopolymerization initiator is less than 0.1 part by weight, the curability may be insufficient.

(iii) Flame Retardance-imparting Component

The photosensitive composition of the invention may also include, if necessary, any of various flame retardance-imparting components, for example, halogenated flame retardants such as brominated epoxy compounds, metal hydroxides such as aluminum hydroxide and magnesium hydroxide, phosphorus-based flame retardants such as phosphoric acid ester compounds and ammoniumpolyphosphate, and flame retardant aids such as antimony trioxide.

As the use of a phosphorus-containing urethane (meth)acrylate compound as the curing component according to the invention can markedly improve the flame retardance, flame retardance-imparting components need not be used, but even higher flame retardance can be achieved if they are used in combination. In such cases, high flame retardance can be maintained with much lower amounts of addition than by the prior art, such that the objects of dehalogenation and elimination of antimony can be achieved.

(iv) Thermosetting Resin

According to the invention, a thermosetting resin may be added to the photosensitive composition as a thermosetting component if necessary. Such a thermosetting resin may be one which itself undergoes curing upon heating, or which reacts with the carboxyl group of a carboxyl group-containing urethane (meth)acrylate compound upon heating. Such thermosetting resins may be used alone or in combinations of two or more. Epoxy resins are preferred.

As the epoxy resins there may be mentioned epoxy compounds with two or more epoxy groups in the molecule, such as bisphenol A epoxy resins, hydrogenated bisphenol A epoxy resins, brominated bisphenol A epoxy resins, bisphenol F epoxy resins, novolac epoxy resins, phenol-novolac epoxy resins, cresol-novolac epoxy resins, N-glycidyl epoxy resins, bisphenol A novolac epoxy resins, chelate-type epoxy resins, glyoxal epoxy resins, amino group-containing epoxy resins, rubber-modified epoxy resins, dicyclopentadiene phenolic epoxy resins, silicone-modified epoxy resins, $\epsilon$-caprolactone-modified epoxy resins, bisphenol S epoxy resins, diglycidyl phthalate resins, heterocyclic epoxy resins, bi-xylenol epoxy resins, biphenyl epoxy resins and tetraglycidyl xylenoylethane resins. Biphenyl epoxy resins and heterocyclic epoxy resins are especially preferred from the standpoint of obtaining cured products with high heat resistance.

When a thermosetting resin is also used in the photosensitive composition of the invention, its content is preferably 10–150 parts by weight and more preferably 10–50 parts by weight to 100 parts by weight of the total photocuring component.

The proportion of the thermosetting resin with respect to the total photosensitive composition is preferably 5–40 wt %.

If the thermosetting resin content is too low, the solder heat resistance of cured films obtained from the photosensitive composition may be insufficient. If it is too high, on the other hand, the contraction of the cured film will be more pronounced, tending to result in increased curling when the cured film is used for an insulating/protecting film of an FPC board.

When a thermosetting resin is used for the invention, there may also be used if necessary a thermal polymerization catalyst which exhibits an effect of thermosetting the thermosetting resin. Specifically, there may be used amines, amine salts such as chlorides or quaternary ammonium salts of amines, acid anhydrides such as cyclic fatty acid anhydrides, fatty acid anhydrides and aromatic acid anhydrides, polyamides, imidazoles, nitrogen-containing heterocyclic compounds such as triazine compounds, and organic metal compounds. These may be used alone or in combinations of two or more.

The amount of a thermal polymerization catalyst used is 0.5–20 parts by weight and preferably 1–10 parts by weight to 100 parts by weight of the thermosetting resin. If the thermal polymerization catalyst is used in an amount of less than 0.5 part by weight, the curing reaction does not proceed sufficiently, resulting in reduced heat resistance. It can also be a cause of reduced operating efficiency since a longer time and higher temperature will be required for the curing. If the amount is greater than 20 parts by weight, reaction occurs with the carboxyl groups in the photosensitive composition, tending to result in gelling and reduced storage stability.

(v) Other Components

The photosensitive composition according to the invention may also contain other photopolymerizable oligomers. As such photopolymerizable oligomers there may be mentioned epoxy-based acrylates, urethane-based acrylates, ester-based acrylates, acrylic-based acrylates, silicone-based acrylates, unsaturated polyesters, alicyclic epoxy-based compounds, glycidyl ether-based compounds, vinyl ether-based compounds and oxetane-based compounds. Although there are no particular restrictions on the content of such other components, it is preferably about 5–30 wt % with respect to the total photosensitive composition.

When the photosensitive composition is formed into a film, an organic solvent may be added if necessary for viscosity adjustment. Such viscosity adjustment will facilitate application and printing onto target objects by roller coating, spin coating, screen coating, curtain coating or the like.

As the organic solvents there may be mentioned ketone-based solvents such as ethyl methyl ketone, methyl isobutyl ketone and cyclohexanone; ester-based solvents such as ethyl acetoacetate, $\gamma$-butyrolactone and butyl acetate; alcohol-based solvents such as butanol and benzyl alcohol; cellosolves, carbitols and their ester or ether derivatives such as carbitol acetate and methyl cellosolve acetate; amide-based solvents such as N,N-dimethylformamide, N,N-dimethylacetamide, and N-methyl-2-pyrrolidone; dimethyl sulfoxide; phenol-based solvents such as phenol and cresol; nitro compound-based solvents; aromatic solvents such as toluene, xylene, hexamethylbenzene and cumene; and aromatic or alicyclic solvents comprising hydrocarbons such as tetralin, decalin and dipentene. These may be used alone or in combinations of two or more.

The amount of an organic solvent used is preferably such as to adjust the viscosity of the photosensitive composition to 500–500,000 mPa·s (measured at 25° C. with a Brookfield Viscometer). It is more preferably 1,000–500,000 mPa·s. This range of viscosity is suitable for, and facilitates application and printing onto, target objects. The preferred amount of an organic solvent used to achieve such viscosity is no greater than 1.5 times by weight with respect to the weight of the solid portion other than the organic solvent. At greater than 1.5 times by weight, the solid concentration is reduced, such that a sufficient film thickness cannot be achieved by a single printing when the photosensitive composition is printed onto a substrate, and multiple printing operations therefore become necessary.

A coloring agent may also be added to the photosensitive composition for use as an ink. As the coloring agents there may be mentioned phthalocyanine blue, phthalocyanine green, iodine green, disazo yellow, crystal violet, titanium oxide, carbon black and naphthalene black. For use as an ink as well, the viscosity is preferably 500–500,000 mPa·s (measured at 25° C. with a Brookfield Viscometer).

A fluidity adjustor may also be added to a photosensitive composition of the invention to adjust the fluidity. The fluidity adjustor can provide suitable adjustment of fluidity for the photosensitive composition when applied onto a target object by roller coating, spin coating, screen coating, curtain coating or the like. As examples of the fluidity adjustors there may be mentioned inorganic and organic fillers, waxes, surfactants and the like.

As specific examples of the inorganic fillers there may be mentioned talc, barium sulfate, barium titanate, silica, alumina, silicate compounds, magnesium carbonate, calcium carbonate and aluminum hydroxide. As specific examples of the organic fillers there may be mentioned silicone resins, silicone rubber and fluorine-containing resins. As specific examples of the waxes there may be mentioned polyamide wax and polyethylene oxide wax. As specific examples of the surfactants there may be mentioned silicone oil, higher fatty acid esters and amides. These fluidity adjustors may be used alone or in combinations of two or more. This use of an inorganic filler is preferred to provide the photosensitive composition with not only fluidity but also other properties such as adhesion and hardness.

If necessary, there may be added to the photosensitive composition other additives such as thermal polymerization inhibitors, thickening agents, defoaming agents, leveling agents, adhesion-imparting agents, and the like.

As the thermal polymerization inhibitors there may be mentioned hydroquinone, hydroquinone monomethyl ether, tert-butylcatechol, pyrogallol and phenothiazine.

As the thickening agents there may be mentioned laminar silicates such as hectorite, montmorillonite, saponite, bidellite, stevensite, tetrasilicic mica and taeniolite, as well as intercalated compounds obtained by organic cation treatment of the layered silicates, silica, organic silica, and the like.

The defoaming agent is used to eliminate foam produced during application and curing, and specific agents include acrylic-based and silicone-based surfactants.

The leveling agent is used to eliminate irregularities in the film surface produced during printing and application, and specific agents include acrylate-based and silicone-based surfactants. As adhesion-imparting agents there may be mentioned imidazole-based, thiazole-based, triazole-based and silane coupling agents.

Other additives which may be used include, for example, ultraviolet absorbers and plasticizers, for improved storage stability, and these may be added in ranges which do not impede the purpose of the invention.

(3) Production Process for the Photosensitive Composition

A photosensitive composition according to the invention may be produced by mixing each of the aforementioned components by ordinary methods. There are no particular restrictions on the mixing method, and a portion of the components may be mixed first followed by the remaining components, or all of the components may be mixed as a single batch.

Specifically, the mixing of the components is preferably followed by melt kneading, and for example, known kneading means such as a Banbury mixer, a kneader, a roll, a bead mill, a single-screw or a twin-screw extruder or a co-kneader may be used for melt kneading. The melting temperature is preferably in the range of 60–130° C.

(4) Cured Products of the Photosensitive Compositions and their Uses

A photosensitive composition of the invention may be used as an ink, paint coating agent, adhesive, or the like. In particular, a cured product may be obtained by applying the composition to an appropriate thickness on a substrate, heat treating and drying, and then exposing, developing and heat curing to harden it.

A photosensitive composition of the invention may be employed for any of a variety of purposes, but because of its excellent photosensitivity and alkali developing property, as well as superior adhesion with substrates, insulating properties, heat resistance, warp deformation properties, flexibility and outer appearance, when cured into a thin film, it is suitable for use as an insulating protective film for a printed wiring board.

For formation of an insulating protective film, there may be mentioned a method in which the photosensitive composition or ink is applied onto a circuit-formed substrate to a thickness of 10–100 μm, then dried by heat treating in a temperature range of 60–100° C. for about 5–30 minutes to a thickness of 5–70 μm, exposed through a negative mask with the desired exposure pattern, developed by removal of the unexposed sections with a developing solution, and heat cured in a temperature range of 100–180° C. for 20–60 minutes for curing. The photosensitive composition not only exhibits flame retardance but also especially excellent flexibility when cured, as well as superior plasticity, and is therefore particularly suited for used as an insulating protective film for an FPC board, to allow manufacture of FPC boards with low curling and excellent handleability.

The composition may also be used as an insulating resin layer between layers of multilayer printed wiring boards, for example.

The activating light used for exposure may be activating light emitted from known activating light sources such as, for example, a carbon arc, mercury vapor arc, xenon arc lamp or the like. The sensitivity of the photopolymerization initiator in the photosensitive layer will usually be greatest in the ultraviolet range, and therefore the activating light source is preferably one which effectively emits ultraviolet rays. Of course, when the photopolymerization initiator is one which is sensitive to visible light, such as 9,10-phenanthrenequinone, for example, visible light may be used as the activating light, emitted from a light source such as a photographic flood lamp or solar lamp instead of the activating light sources mentioned above.

The developing solution may be an aqueous alkali solution of potassium hydroxide, sodium hydroxide, sodium carbonate, potassium carbonate, sodium phosphate, sodium silicate, ammonia, an amine, or the like.

A photosensitive composition of the invention may also be used as the photosensitive layer of a photosensitive dry film. A photosensitive dry film has a photosensitive layer comprising a photosensitive composition on a support composed of a polymer film or the like. The thickness of the photosensitive layer is preferably 10–70 μm.

Examples of the polymer films used as the supports include films made of polyester resins such as polyethylene terephthalate and aliphatic polyesters, and polyolefin resins such as polypropylene and low density polyethylene, among which films made of polyesters and low density polyethylene are preferred. Such polymer films must later be removed from the photosensitive layers, and therefore are preferably easily removable from photosensitive layers. The thickness of such a polymer film is normally 5–100 μm and preferably 10–30 μm.

A photosensitive dry film may be produced by a photosensitive layer forming step wherein the photosensitive composition is applied onto a support and dried. Also, by providing a cover film on the formed photosensitive layer it is possible to produce a photosensitive dry film having a support, photosensitive layer and cover film laminated in succession, for films on both sides of the photosensitive layer.

Use of the photosensitive dry film to form an insulating protective film on a printed wiring board first involves an attachment step wherein the photosensitive layer of the photosensitive dry film and the substrate are attached. When the photosensitive dry film used is provided with a cover film, the cover film is peeled off to expose the photosensitive layer before contact with the substrate. The photosensitive layer and substrate are then thermo-compression bonded with a pressure roller at about 40–120° C. for lamination of the photosensitive layer on the substrate.

This is followed by an exposure step wherein the photosensitive layer is exposed to light through a negative mask with the desired exposure pattern, a step wherein the support is peeled from the photosensitive layer, a developing step wherein the unexposed sections are removed by development with a developing solution and a heat curing step wherein the photosensitive layer is heat cured, to allow manufacture of a printed wiring board provided with an insulating protective film on the surface of the substrate. Such a photosensitive dry film may be used to form insulating resin layers between layers of multilayer printed wiring boards.

The activating light and developing solution used for exposure may be the same as described above.

In the various applications described above, the photosensitive composition of the invention is expected to exhibit excellent film formability and transparency, as well as high flame retardance. Moreover, by combination with other flame retardance-imparting components, even greater flame retardance can be exhibited. On the other hand, it can also form cured films that maintain an attractive outer appearance and high flexibility, and that exhibit excellent photosensitivity and developing properties while satisfying elements of performance such as heat resistance, electrical insulation and adhesion with wiring boards. The cured films are particularly superior in terms of transparency, flame retardance, flexibility, electrical insulating properties and outer appearance. Even when used for thin wiring boards such as FPC boards, therefore, they are capable of forming insulating protective films that produce no curling and have excellent electrical properties and handleability with satisfactory flexibility.

EXAMPLES

The present invention will now be explained in greater detail through examples, with the understanding that the invention is in no way limited to the examples.

Example 1

In a reactor equipped with a stirrer, thermometer and condenser there were charged 225 g (=0.3 mol) of EXOLIT™ OP550 (by Clariant (Japan) K.K., molecular weight: 750) as a phosphorus-containing polymeric polyol, 40.2 g (=0.3 mol) of dimethylolpropionic acid as a carboxyl group-containing dihydroxy compound and 155.4 g (=0.7 mol) of isophorone diisocyanate as an organic diisocyanate compound. After heating to 60° C. while stirring, 0.15 g of dibutyltin dilaurate was added. When the temperature in the reactor began to fall, it was again heated to 70° C., a temperature of 70–80° C. was maintained while continuing stirring, and the reaction was suspended when the residual NCO concentration reached the theoretical value to synthesize a urethane oligomer. After then introducing into the reactor 0.1 g each of p-methoxyphenol and di-t-butylhydroxytoluene, 24.0 g (=0.21 mol) of 2-hydroxyethyl acrylate was added as a hydroxyl group-containing acrylic acid ester and the reaction was resumed. The reaction was completed upon confirming disappearance of the isocyanate group absorption peak (2280 cm$^{-1}$) in the infrared absorption spectrum, to obtain a phosphorus-containing urethane acrylate 1 as a viscous liquid. Methyl ethyl ketone was used as the synthesis solvent.

The residue upon heating of the obtained phosphorus-containing urethane acrylate was 50 wt %, the number-average molecular weight was 9,000, and the solid portion acid value was 40 mgKOH/g. To 100 parts by weight of this urethane acrylate there were added 8 parts by weight of dipentaerythritol hexacrylate M400 (product of TOAGOSEI Co., Ltd.) as a photopolymerizable monomer, 2 parts by weight of 2,4,6-trimethylbenzoyldiphenylphosphine oxide TPO (product of BASF Co.) as a photopolymerization initiator and 2 parts by weight of 2,2-dimethoxy-1,2-diphenylethan-1-one, Irgacure™ 651 (product of Ciba Specialty Chemicals), in the form of a 50 wt % solution in methyl ethyl ketone, after which the mixture was subjected to ~3 minutes of stirring with a HM-500 Hybrid Mixer (product of Keyence Co.) and 2 minutes of defoaming agitation to obtain a photosensitive composition 1.

Example 2

A phosphorus-containing urethane acrylate 2 was synthesized in the same manner as Example 1, except for using 75 g (=0.1 mol) of the phosphorus-containing polymeric polyol EXOLIT™ OP550 (by Clariant (Japan) K.K., molecular weight: 750) used in Example 1, 93.8 g (=0.7 mol) of dimethylolpropionic acid as the carboxyl group-containing dihydroxy compound, 199.8 g (=0.9 mol) of isophorone diisocyanate as the polyisocyanate and 24.0 g (=0.21 mol) of 2-hydroxyethyl acrylate as the hydroxyl group-containing (meth)acrylate. The residue upon heating of the obtained urethane acrylate was 40 wt %, the number-average molecular weight was 14,000, and the acid value was 96 mgKOH/g. This phosphorus-containing urethane acrylate 2 was then used to obtain a photosensitive composition 2 in the same manner as Example 1.

Example 3

A phosphorus-containing urethane acrylate 3 was synthesized in the same manner as Example 1, except that the phosphorus-containing polymeric polyol mentioned in Example 1 was changed to 76.2 g (=0.3 mol) of Adecapolyol FC-450 (product of Asahi Denka Co., Ltd., molecular weight: 254). The residue upon heating of the obtained urethane acrylate was 50 wt %, the weight-average molecular weight was 11,000, and the acid value was 60 mgKOH/g. This phosphorus-containing urethane acrylate 3 was then used to obtain a photosensitive composition 3 in the same manner as Example 1.

Example 4

A phosphorus-containing urethane acrylate 4 was synthesized in the same manner as Example 1, except that the phosphorus-containing polymeric polyol mentioned in Example 1 was changed to 66.6 g (=0.3 mol) of n-butyl-bis (3-hydroxypropyl)phosphine oxide PO-4500 (product of Nippon Chemical Industrial Co., Ltd., molecular weight: 222). The residue upon heating of the obtained urethane acrylate was 50 wt %, the number-average molecular weight was 8,000, and the acid value was 50 mgKOH/g. This phosphorus-containing urethane acrylate 4 was then used to obtain a photosensitive composition 4 in the same manner as Example 1.

Example 5

A phosphorus-containing urethane acrylate 5 was synthesized in the same manner as Example 1, except for using 225 g (=0.3 mol) of the phosphorus-containing polymeric polyol EXOLIT™ OP550 (by Clariant (Japan) K.K., molecular weight: 750), 85 g (=0.1 mol) of the polytetramethylene diol PTG-850SN (product of Hodogaya Chemical Industrial Co., Ltd., molecular weight: 850), 40.2 g (=0.3 mol) of dimethylolpropionic acid as the carboxyl group-containing dihydroxy compound, 177.6 g (=0.8 mol) of isophorone diisocyanate as polyisocyanate and 24.0 g (=0.21 mol) of 2-hydroxyethyl acrylate as the hydroxyl group-containing (meth)acrylate. The residue upon heating of the obtained urethane acrylate was 50 wt %, the number-average molecular weight was 10,000, and the acid value was 36 mgKOH/g. This phosphorus-containing urethane acrylate 5 was then used to obtain a photosensitive composition 5 in the same manner as Example 1.

Comparative Example 1

A phosphorus-free urethane acrylate C1 was synthesized in the same manner as Example 1, except for using 300 g (=0.3 mol) of polycaprolactone diol (PLACCEL™ 210 by Dicel Chemical Industries, Ltd., molecular weight: 1000) as the polymeric polyol, 40.2 g (=0.3 mol) of dimethylolpropionic acid as the carboxyl group-containing dihydroxy compound, 155.4 g (=0.7 mol) of isophorone diisocyanate as the polyisocyanate and 24.0 g (=0.21 mol) of 2-hydroxyethyl acrylate as the hydroxyl group-containing (meth)acrylate. The residue upon heating of the obtained urethane acrylate was 50 wt %, the number-average molecular weight was 23,000, and the solid portion acid value was 46 mgKOH/g. This phosphorus-free urethane acrylate C1 was then used to obtain a photosensitive composition C1 in the same manner as Example 1.

Comparative Example 2

A phosphorus-free urethane acrylate C2 was synthesized in the same manner as Comparative Example 1, except for using 100 g (=0.1 mol) of polycaprolactone diol (PLACCEL™ 210 by Dicel Chemical Industries, Ltd., molecular weight: 1000) as the polymeric polyol, 93.8 g (=0.7 mol) of dimethylolpropionic acid as the carboxyl group-containing dihydroxy compound, 199.8 g (=0.9 mol) of isophorone diisocyanate as the polyisocyanate and 24.0 g (=0.21 mol) of 2-hydroxyethyl acrylate as the hydroxyl group-containing (meth)acrylate. The residue upon heating of the obtained urethane acrylate was 40 wt %, the number-average molecular weight was 20,000, and the solid portion acid value was 98 mgKOH/g. This phosphorus-free urethane acrylate C2 was then used to obtain a photosensitive composition C2 in the same manner as Example 1.

<Fabrication of Test Samples>

Test samples for property evaluation were fabricated using the photosensitive compositions obtained in Examples 1–5 and Comparative Examples 1 and 2. A doctor blade was used to apply 75 μm of each of the photosensitive compositions obtained in Examples 1–5 and Comparative Examples 1 and 2 onto a polyimide film (Kapcone™ 300H, product of DuPont-Toray). The coated side was dried at 70° C. for 30 minutes to form a 40 μm-thick photosensitive composition layer to complete each test sample. For evaluation of the oxygen index, a sample was prepared by forming a 40 μm-thick photosensitive layer on both sides of a polyimide film.

<Exposure, Development and Heat Curing of Test Samples>

The test sample for the oxygen index measurement was exposed on both sides to 1,000 mJ/cm² rays with an HMW-680GW exposure unit (product of Orc Co., Ltd.) equipped with a metal halide lamp.

The test sample for evaluation of the photosensitivity and developing property (single-sided application) was exposed to 1,000 mJ/cm² rays with an HMW-680GW exposure unit (product of Orc Co., Ltd.) equipped with a metal halide lamp, using a 21-step tablet by Hitachi Chemical Co., Ltd. as the negative pattern. It was then cleaned for one minute with a 1 wt % aqueous sodium carbonate solution at 30° C. under conditions with a spray pressure of 2 kg/cm² for development to remove the unexposed portions, and dried at 60° C. for 20 minutes.

<Property Evaluation>

The property evaluation was conducted in the following manner. The results are shown in Table 1.

[Evaluated Properties]

Oxygen Index

This was measured according to JIS K7201. A higher oxygen index indicates more satisfactory flame retardance.

Photosensitivity

A 21-step tablet by Hitachi Chemical Co., Ltd. as the negative pattern was placed on the test sample and they were exposed to 1000 mJ/cm² rays. It was then cleaned for one minute with a 1 wt % aqueous sodium carbonate solution at 30° C. to remove the unexposed portions for development, and the number of step tablet levels on the photocured film formed on the polyimide laminate was measured to evaluate the photosensitivity of the curing flame retardant composition. The photosensitivity is shown by the number of step tablet levels, with a higher number of step tablet levels indicating higher photosensitivity.

Developing Property

For evaluation of the photosensitivity, the condition of the polyimide layer was visually observed after development for 1 minute at 30° C. under conditions with a spray pressure of 2 kg/cm² using a 1 wt % aqueous sodium carbonate solution as the developing solution.

The symbols in Table 1 are listed below.

TABLE 1

| Photosensitive composition | Oxygen index | Photosensitivity | Developing property |
|---|---|---|---|
| Example 1 | 24.5 | 8 | ○ |
| Example 2 | 23.0 | 7 | ⊚ |
| Example 3 | 25.5 | 8 | ○ |
| Example 4 | 25.5 | 7 | ○ |
| Example 5 | 23.0 | 8 | ○ |
| Comp. Ex. 1 | 19.5 | 8 | ○ |
| Comp. Ex. 2 | 19.0 | 7 | ⊚ |

⊚: Developed
○: Slight development residue present

INDUSTRIAL APPLICABILITY

The photosensitive compositions of the invention employ phosphorus-containing urethane (meth)acrylate compounds with high flame retardance as the photocuring components, and thereby exhibit excellent flame retardance in addition to the properties of photosensitivity, developing property, flexibility and the like. They are therefore useful as inks, paint coating agents, adhesives and the like, and are particularly suitable for formation of coverlays, solder resists and the like for FPCs.

The invention claimed is:

1. A phosphorus-containing urethane (meth)acrylate compound obtained by reacting (A) a polyol compound comprising (A1) a phosphorus-containing polyol having a phosphorus atom, represented by the following general formula (5):

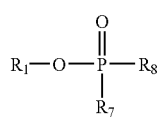 (5)

where $R_1$ is hydrogen, $C_{1-18}$ alkyl or $C_{6-20}$ aryl, $R_7$ is $C_{1-18}$ alkyl or $C_{6-20}$ aryl, and $R_8$ is a group selected from the group consisting of polyhydroxyalkyl, polyhydroxyaryl, polyhydroxyalkylaminoalkyl, polyhydroxyarylaminoalkyl, polyhydroxyalkylaminoaryl, polyhydroxyarylaminoaryl, polyhydroxyalkyloxycarbonylalkyl, polyhydroxyalkyloxycarbonylaryl, polyhydroxyaryloxycarbonylalkyl and polyhydroxyarycarbonylaryl, and (A2-1) a carboxyl group-containing, phosphorus-free polyol having one or more carboxyl groups and two or more alcoholic hydroxyl groups, with (B) a polyisocyanate having two or more functional groups and (C) a hydroxyl group-containing (meth)acrylate.

2. The phosphorus-containing urethane (meth)acrylate compound according to claim 1, wherein the proportion of the phosphorus-containing polyol (A1) in the polyol compound (A) which comprises the phosphorus-containing polyol (A1) and a phosphorus-free polyol (A2), is 30–100 wt % with respect to the total of the polyol compound (A).

3. The phosphorus-containing urethane (meth)acrylate compound according to claim 1, wherein the phosphorus content of the phosphorus-containing polyol (A1) is 5 wt % or greater.

4. The phosphorus-containing urethane (meth)acrylate compound according to claim 1, wherein the carboxyl group-containing polyol (A2-1) is at least one branched or linear dihydroxyalkanoic polycarboxylic acid.

5. The phosphorus-containing urethane (meth)acrylate compound according to claim 1, wherein the polyisocyanate having two or more functional groups (B) is at least one selected from the group consisting of 2,4-toluene diisocyanate, 2,6-toluene diisocyanate, isophorone diisocyanate, hexamethylene diisocyanate, diphenylmethylene diisocyanate, (o, m or p)-xylene diisocyanate, methylenebis (cyclohexyl isocyanate), trimethylhexamethylene diisocyanate, cyclohexane-1,3-dimethylene diisocyanate, cyclohexane-1,4-dimethylene diisocyanate and 1,5-naphthalene diisocyanate.

6. The phosphorus-containing urethane (meth)acrylate compound according to claim 1, wherein the hydroxyl group-containing (meth)acrylate (C) is at least one selected from the group consisting of 2-hydroxyethyl (meth)acrylate, hydroxypropyl (meth)acrylate, hydroxybutyl (meth)acrylate, caprolactone or alkylene oxide adducts of any of the above acrylates, glycerin mono(meth)acrylate, glycerin di(meth)acrylate, glycidyl methacrylate-acrylic acid adduct, trimethylolpropane mono(meth)acrylate, trimethylol di(meth)acrylate, pentaerythritol tri(meth)acrylate, dipentaerythritol penta(meth)acrylate, ditrimethylolpropane tri(meth)acrylate and trimethylolpropane-alkylene oxide adduct-di(meth)acrylate.

7. The phosphorus-containing urethane (meth)acrylate compound according to claim 1, wherein the acid value of the solid portion is 5–150 mgKOH/g.

8. The phosphorus-containing urethane (meth)acrylate compound according to claim 1, wherein the weight-average molecular weight is 1,000–40,000.

* * * * *